(12) United States Patent
Craig et al.

(10) Patent No.: US 8,103,998 B2
(45) Date of Patent: Jan. 24, 2012

(54) VERIFYING NON-DETERMINISTIC BEHAVIOR OF A DESIGN UNDER TEST

(75) Inventors: Jesse E. Craig, South Burlington, VT (US); Suzanne Granato, Essex Junction, VT (US); Francis A. Kampf, Jeffersonville, VT (US); Barbara L. Powers, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 457 days.

(21) Appl. No.: 12/034,161

(22) Filed: Feb. 20, 2008

(65) Prior Publication Data
US 2009/0210837 A1   Aug. 20, 2009

(51) Int. Cl.
*G06F 17/50* (2006.01)
(52) U.S. Cl. .......................................... 716/106
(58) Field of Classification Search .................. 716/1, 5, 716/100, 106
See application file for complete search history.

(56) References Cited

U.S. PATENT DOCUMENTS

| | | | |
|---|---|---|---|
| 5,729,554 A | 3/1998 | Weir et al. | |
| 6,453,463 B1 | 9/2002 | Chaudhry et al. | |
| 6,895,587 B2 | 5/2005 | Breslau et al. | |
| 6,928,645 B2 | 8/2005 | Wang et al. | |
| 7,483,824 B1 * | 1/2009 | Hill | 703/14 |
| 7,797,687 B2 * | 9/2010 | Tillmann et al. | 717/131 |
| 7,996,801 B2 * | 8/2011 | Wong | 716/106 |
| 2005/0081094 A1 * | 4/2005 | Kadkade et al. | 714/12 |
| 2005/0160404 A1 * | 7/2005 | Nachmanson et al. | 717/124 |
| 2006/0156268 A1 * | 7/2006 | Wen et al. | 716/18 |
| 2006/0206840 A1 * | 9/2006 | Iwamura | 716/5 |
| 2007/0033552 A1 * | 2/2007 | Li | 716/4 |
| 2007/0074135 A1 | 3/2007 | Craig et al. | |
| 2008/0126899 A1 * | 5/2008 | Brennan et al. | 714/732 |
| 2008/0127009 A1 * | 5/2008 | Veneris et al. | 716/4 |
| 2009/0177936 A1 * | 7/2009 | Koenemann et al. | 714/737 |

OTHER PUBLICATIONS

Von Praun, C. et al., "Implicit Parallelism with Ordered Transactions", IBM Research Report, Sep. 18, 2006, pp. 1-9.
Raghavan, P, et al., "Dynamic Schemes for Speculative Execution of Code", Jul. 1998, pp. 1-6.

(Continued)

*Primary Examiner* — Suchin Parihar
(74) *Attorney, Agent, or Firm* — Richard Kotulak; Roberts Mlotkowski Safran & Cole, P.C.

(57) ABSTRACT

The invention generally relates to design verification, and more particularly to verification of non-deterministic behavior of a design under test. A method includes predicting a plurality of behaviors of a design under test (DUT), and forking respective verification tasks for each one of the plurality of behaviors. The method further includes verifying an actual behavior of the DUT with each of the verification tasks, and terminating a respective one of the verification tasks when the actual behavior of the DUT does not conform to the respective one of the verification tasks.

18 Claims, 5 Drawing Sheets

OTHER PUBLICATIONS

Dubey, P.K. et al., "Single-Program Speculative Multithreading (SPSM) Architecture: Compiler-assisted Fine-Grained Multithreading", IBM Research Report, Feb. 6, 1995, pp. 1-32.

Bader, A. et al., "Testing Concurrency and Communication in Distributed Objects", Dec. 1998, pp. 1-7.

Locasto, M.E., et al., "Speculative Virtual Verification: Policy-Constrained Speculative Execution", NSPW 2005, URL: http://www1.cs.columbia.edu/~angelos/Papers/2005/svv2005nsnwpdf, pp. 1-6.

Littin, R., "Data and Control Speculative Execution", pp. 1-9, URL: http://www.cs.waikato.ac.nz/timewarp/wengine/papers/gc99_1/.

Craig, J., "Reduction of Redundancy in Directed Random Verification through Checkpointing", M.Sc. Thesis, University of Vermont, Department of Computer Science, Technical Report CS-06-09, Apr. 2006, pp. 1-12.

* cited by examiner

| Simulation time | Occurrence | Checker function | Action regarding objects | Existing Objects |
|---|---|---|---|---|
| t(1) | input W | predicted output = ABCDEFG | create Object1 | Object1 |
| t(2) | input X | no change | none | Object1 |
| t(3) | input Y | predicted output = ABCEFG | create Object2 | Object1 Object2 |
| t(4) | input Z | predicted output =ABCDEH | create Object3 | Object1 Object2 Object3 |
| t(n) | DUT output = ABC | compare | none | Object1 Object2 Object3 |
| t(n+1) | DUT output = ABCD | compare | terminate Object2 | Object1 Object3 |
| t(n+2) | DUT output = ABCDEF | compare | terminate Object3 | Object1 |
| t(n+3) | DUT output = ABCDEFK | compare | terminate Object1 | none |
| t(n+3) | DUT output = ABCDEFG | compare | none | Object1 |

VERIFYING NON-DETERMINISTIC BEHAVIOR OF A DESIGN UNDER TEST

FIELD OF THE INVENTION

The invention generally relates to design verification, and more particularly to verification of non-deterministic behavior of a design under test.

BACKGROUND OF THE INVENTION

Circuit designs (e.g., for computer hardware) are normally verified before being fabricated. During verification, a design is sometimes referred to as a design under test (DUT). Typically, a DUT is verified by running a simulation program on a computer during which different inputs (called stimuli, inputs, or events) are in turn applied to the DUT, and the signals at the outputs of the DUT are collected and compared with expected values of the design specification. When actual output values of the DUT do not agree with predicted values of the design specification, the circuit design is considered defective and is usually re-designed.

Often times, a particular input to a DUT yields a single, predictable output. For example, input A results in output X, while input B results in output Y. Conventional verification software often very straightforwardly compares a predicted output to the actual output of the DUT as the simulation time advances.

Sometimes, however, the specification of the circuit design defines multiple outcomes when an event occurs within a specific time frame, such that the verification software cannot predict definitive behavior. For example, input A might validly result in either output X or Y. Put another way, as a set of inputs propagate (e.g., race) through the DUT, more than one valid output might be predicted. In such cases, the DUT is said to exhibit non-deterministic behavior. It is difficult to verify DUT's that exhibit non-deterministic behavior, since a given input may result in more than one different output.

An example of non-deterministic behavior is embodied in the PCI-Express Transaction Layer design, which manages buffer space for packet transmission and reception. If the buffer is overwritten by packets that exceed the allocated buffer space, an overflow error is reported by the circuit (also referred to as the core). The allocated buffer space is freed by the processing of received packets by higher layers in the PCI-Express Stack. If buffer space is freed around the time a packet is received that would cause an overflow, depending upon the logic implementation and amount of pipelining in the core, the buffer overflow error may (or may not) be reported. Either outcome is correct behavior based upon the specification as long as the two events occurred within a specific amount of time relative to each other.

Some state machines that are internal to a DUT represent another example of non-deterministic behavior. Since the entire state machine is typically treated as a black box, the verifiers only have access to two items: the inputs going into the DUT and the outputs coming from the DUT. There is no access to the actual state the DUT is in at any given time.

A common way to verify a black box state machine is to build an external model that implements the same states, and is given the same stimulus as the DUT. If at any time the outputs of the DUT are different from the outputs of the model, then it is said that the DUT (or model) has made an invalid transition or is behaving inappropriately (based on the design specifications).

However, there are many problems with this approach. The implementation of the two state machines (the DUT and the model) can be very different. One could pipeline incoming data so it sees inputs at a different point in time than the other. This would cause the outputs to be different at a given time, but neither state machine is wrong. Many false fails will be found this way, and a lot of time is normally spent trying to match the model to the DUT implementation.

Another conventional design pattern that is sometimes used for verifying state machines is known as the "State" pattern. This pattern is commonly used in object oriented programming and describes a method of partitioning a function that is state dependant into several discrete classes, all of which inherit from a common parent class, allowing them to be used interchangeably. While this method of representing state based behavior is robust and maintainable, it requires that only one state is considered valid at any one-time. This limitation is a problem when attempting to verify a DUT that exhibits non-deterministic behavior.

Accordingly, there exists a need in the art to overcome the deficiencies and limitations described hereinabove.

SUMMARY OF THE INVENTION

In a first aspect of the invention, there is a method that includes predicting a plurality of behaviors of a design under test (DUT), and forking respective verification tasks for each one of the plurality of behaviors. The method further includes verifying an actual behavior of the DUT with each of the verification tasks, and terminating a respective one of the verification tasks when the actual behavior of the DUT does not conform to the respective one of the verification tasks.

In another aspect of the invention, there is a method of verifying non-deterministic behavior of a design under test (DUT). The method includes receiving input that is provided to the DUT, and determining a plurality of predicted behaviors of the DUT based upon the input and a specification associated with the DUT. The method also includes creating respective tasks for each one of the predicted behaviors, and terminating a respective one of the tasks when the predicted behavior associated with the respective one of the tasks does not agree with actual behavior of the DUT. Additionally, the method includes generating and outputting either a test failure report or a success report associated with the DUT.

In another aspect of the invention, a computer program product comprises a computer usable medium having a computer readable program embodied in the medium, wherein the computer readable program when executed on a computing device causes the computing device to: start a simulation of a design under test (DUT) and advance through iterations of the simulation. At least one of the iterations includes comparing a plurality of predicted behaviors of the DUT to an actual behavior of the DUT, and eliminating from consideration any of the plurality of predicted behaviors that do not agree with the actual behavior.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF EMBODIMENTS OF THE INVENTION

The invention generally relates to design verification, and more particularly to verification of non-deterministic behavior of a design under test. For example, aspects of the invention may be used to aid in the verification of a circuit design. Exemplary embodiments of the invention provide a method for verifying non-deterministic behavior of a DUT. In implementations, as simulation time of the DUT advances, a unique verification task is created for each possible predicted behavior of the DUT. In this manner, plural verification tasks may exist at any particular time, each task associated with a respective predicted behavior of the DUT. Concurrently, as simulation time advances, each existing verification task compares its predicted behavior of the DUT to the actual behavior of the DUT. Based upon the comparison, each task determines whether it is still valid (i.e., its predicted behavior conforms with the DUT actual behavior). Tasks are terminated as they become invalid. If at any point there are no valid tasks, then a testing failure of the DUT is indicated. In this manner, implementations of the invention provide an efficient methodology for accommodating non-deterministic behavior of a DUT during verification.

Figure 1:
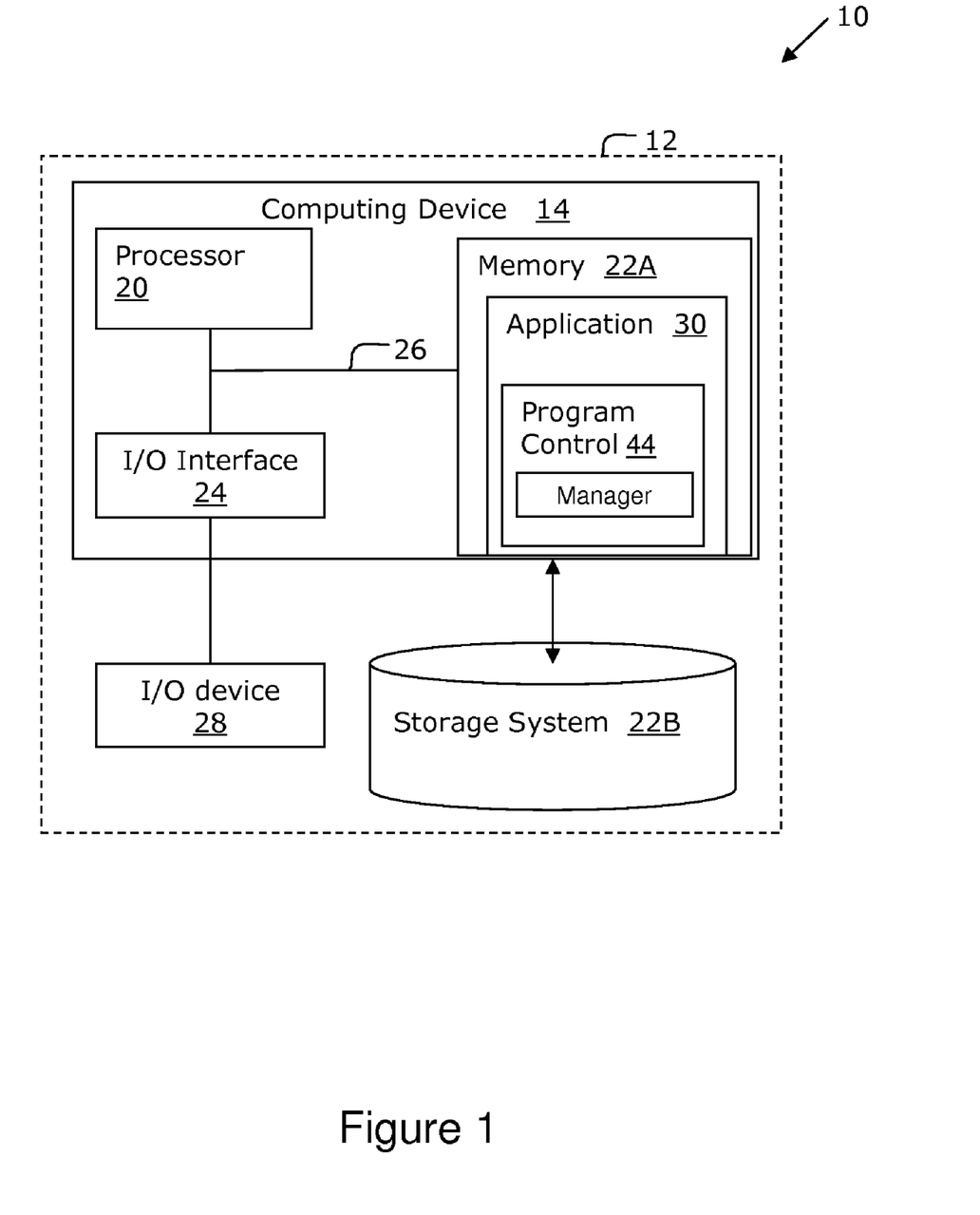
FIG. 1 shows an illustrative environment for implementing the steps in accordance with the invention.

FIG. 1 shows an illustrative environment 10 for managing the processes in accordance with the invention. To this extent, the environment 10 includes a computer infrastructure 12 that can perform the processes described herein. In particular, the computer infrastructure 12 includes a computing device 14 that comprises an application 30 having a program control 44, which makes the computing device 14 operable to perform the processes described herein, such as, for example, verifying non-deterministic behavior of a DUT.

The computing device 14 includes a processor 20, a memory 22A, an input/output (I/O) interface 24, and a bus 26. The memory 22A can include local memory employed during actual execution of program code, bulk storage, and cache memories which provide temporary storage of at least some program code (e.g., program control 44) in order to reduce the number of times code must be retrieved from bulk storage during execution. Further, the computing device 14 is in communication with an external I/O device/resource 28 and a storage system 22B. The I/O device 28 can comprise any device that enables an individual to interact with the computing device 14 or any device that enables the computing device 14 to communicate with one or more other computing devices using any type of communications link. The external I/O device/resource 28 may be keyboards, displays, pointing devices, etc.

The processor 20 executes computer program code (e.g., program control 44), which is stored in memory 22A and/or storage system 22B. While executing computer program code, the processor 20 can read and/or write data to/from memory 22A, storage system 22B, and/or I/O interface 24. The bus 26 provides a communications link between each of the components in the computing device 14.

The computing device 14 can comprise any general purpose computing article of manufacture capable of executing computer program code installed thereon (e.g., a personal computer, server, wireless notebook, smart phone, personal digital assistant, etc.). However, it is understood that the computing device 14 is only representative of various possible equivalent computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 12 is only illustrative of various types of computer infrastructures for implementing the invention. For example, in embodiments, the computer infrastructure 12 comprises two or more computing devices (e.g., a server cluster) that communicate over any type of communications link, such as a network, a shared memory, or the like, to perform the processes described herein. Further, while performing the processes described herein, one or more computing devices in the computer infrastructure 12 can communicate with one or more other computing devices external to computer infrastructure 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

In embodiments, the invention provides a business method that performs the steps of the invention on a subscription, advertising, and/or fee basis. That is, a service provider, such as a Solution Integrator, could offer to perform the processes described herein, such as, for example, verifying non-deterministic behavior of a DUT. In this case, the service provider can create, maintain, deploy, support, etc., a computer infrastructure that performs the process steps of the invention for one or more customers. In return, the service provider can receive payment from the customer(s) under a subscription and/or fee agreement and/or the service provider can receive payment from the sale of advertising content to one or more third parties.

Figure 2:
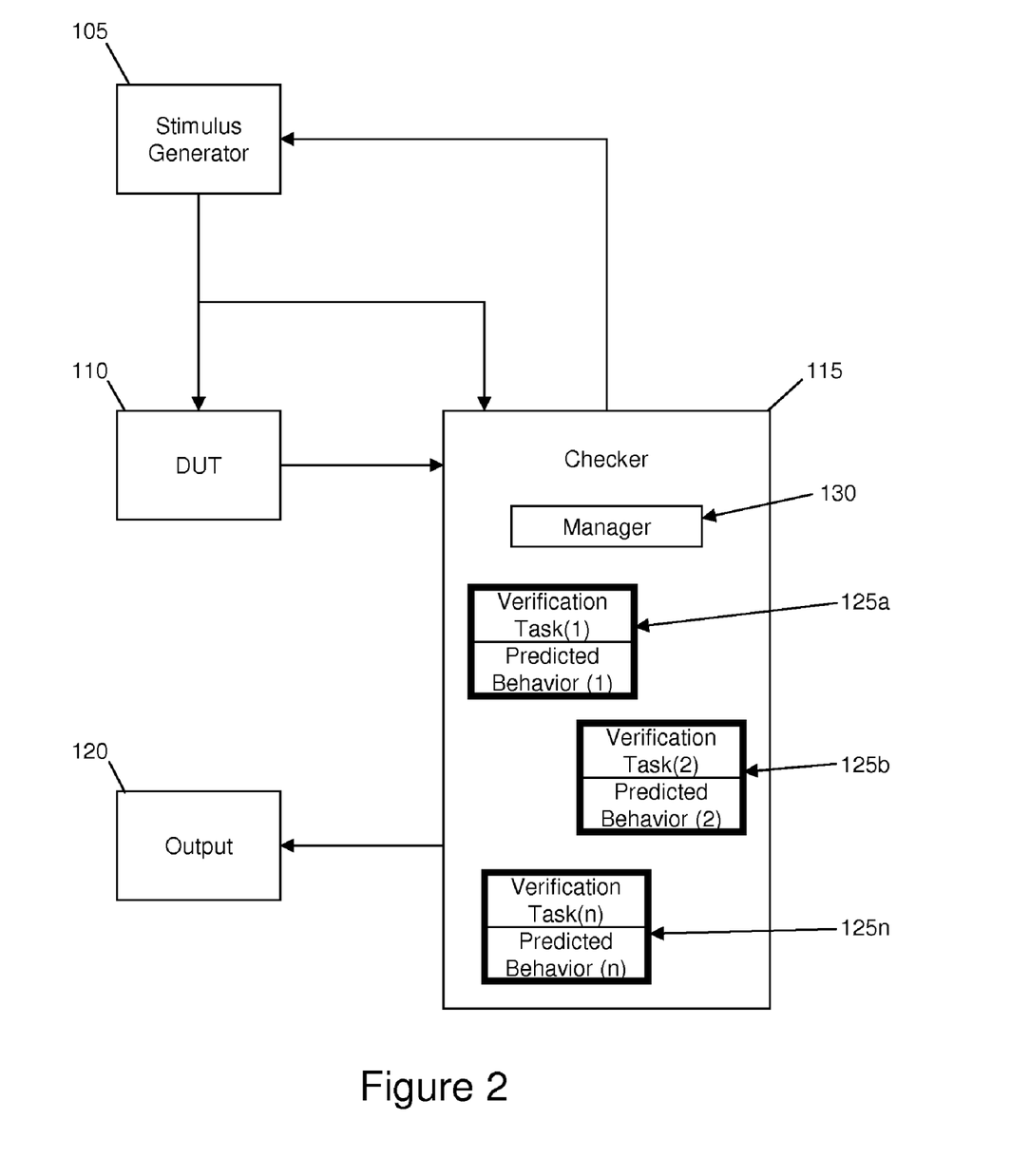
FIG. 2 shows a block diagram according to aspects of the invention.

FIG. 2 shows a block diagram of a system for testing a circuit design in accordance with embodiments of the invention. In embodiments, a stimulus generator 105 generates a predefined series of inputs (e.g., signals) as simulation time advances. The inputs are communicated to a DUT 110 (of the circuit design) and a checker 115. The checker 115 has incorporated therein pertinent information from the specification of the circuit design, such that the checker 115 determines predicted behavior of the DUT 110 based upon the input(s) from the stimulus generator 105.

The DUT 110 exhibits actual behavior (e.g., output data flow, state changes, etc.) based upon the input from the stimulus generator 105. The actual behavior is communicated to the checker 115, where the actual behavior of the DUT 110 is compared to the predicted behavior determined by the checker 115. The checker 115 may communicate results (e.g., pass or fail status of the DUT 110) to an output 120. The checker 115 may also communicate with the stimulus generator 105 to coordinate the advancement of simulation time (e.g., on the rising edge of a clock cycle). The various functions of components of the block diagram can be implemented in a computing environment, such as, for example, that described with respect to FIG. 1. For example, the stimulus generator 105, DUT 110, and checker 115 may be implemented as a software simulation realized via appropriate programming (e.g., program control 44), while the output 120 may comprise an I/O device and/or a data storage device.

According to aspects of the invention, the checker 115 creates respective verification tasks for each possible predicted behavior of the DUT 110 as the simulation time advances. That is to say, when non-deterministic behavior (e.g., plural possible behaviors) is predicted, the checker 115 creates and maintains respective verification tasks (125a, 125b . . . 125n) for each possible predicted behavior. Additionally, the checker 115 terminates verification tasks that are no longer valid based upon the detected actual behavior of the DUT 110.

Moreover, in embodiments, the checker 115 eliminates redundant verification tasks, such that only unique verification tasks propagate as simulation time advances. For example, during each iteration of the simulation tool, the checker 115 may compare all of the existing tasks and eliminate any redundant tasks. Additionally or alternatively, when the checker 115 is creating a new task, it may compare that task to already existing tasks. If the new task would be redundant to an existing task, it is not created.

In embodiments, the checker 115 is implemented in objected oriented programming code (however, the invention is not limited to object oriented programming, and any suitable programming may be used within the scope of the invention). For example, the checker 115 may include a manager 130, such as an object manger (for example as part of a program control 44 described with respect to FIG. 1), which receives the input from the stimulus generator 105 and includes prediction information according to the specification of the circuit design. As input from the stimulus generator 105 arrives, the object manager 130 determines predicted behavior of the DUT based upon the input and the specification, and creates an object associated with that predicted behavior. The created objects correspond to the above-described verification tasks, and each respective object includes a comparison functionality and data associated with a unique predicted behavior of the DUT. In this manner, plural objects corresponding to plural predicted behaviors of a non-deterministic DUT may exist simultaneously. As simulation time advances, new objects may be created based upon new predictions, while invalid objects (e.g., those whose predicted behavior does not conform to the actual output of the DUT) are terminated (e.g., deleted).

For example, in the case of a DUT whose output is data sequences, each possible predicted data sequence is associated with an object created by the object manager as input arrives at the object manager. As the actual data sequence is output from the DUT, it is communicated to each existing object, which compares the actual data sequence to its predicted data sequence. When an object determines that its predicted sequence does not conform to the actual sequence, the object is terminated.

Figure 3:
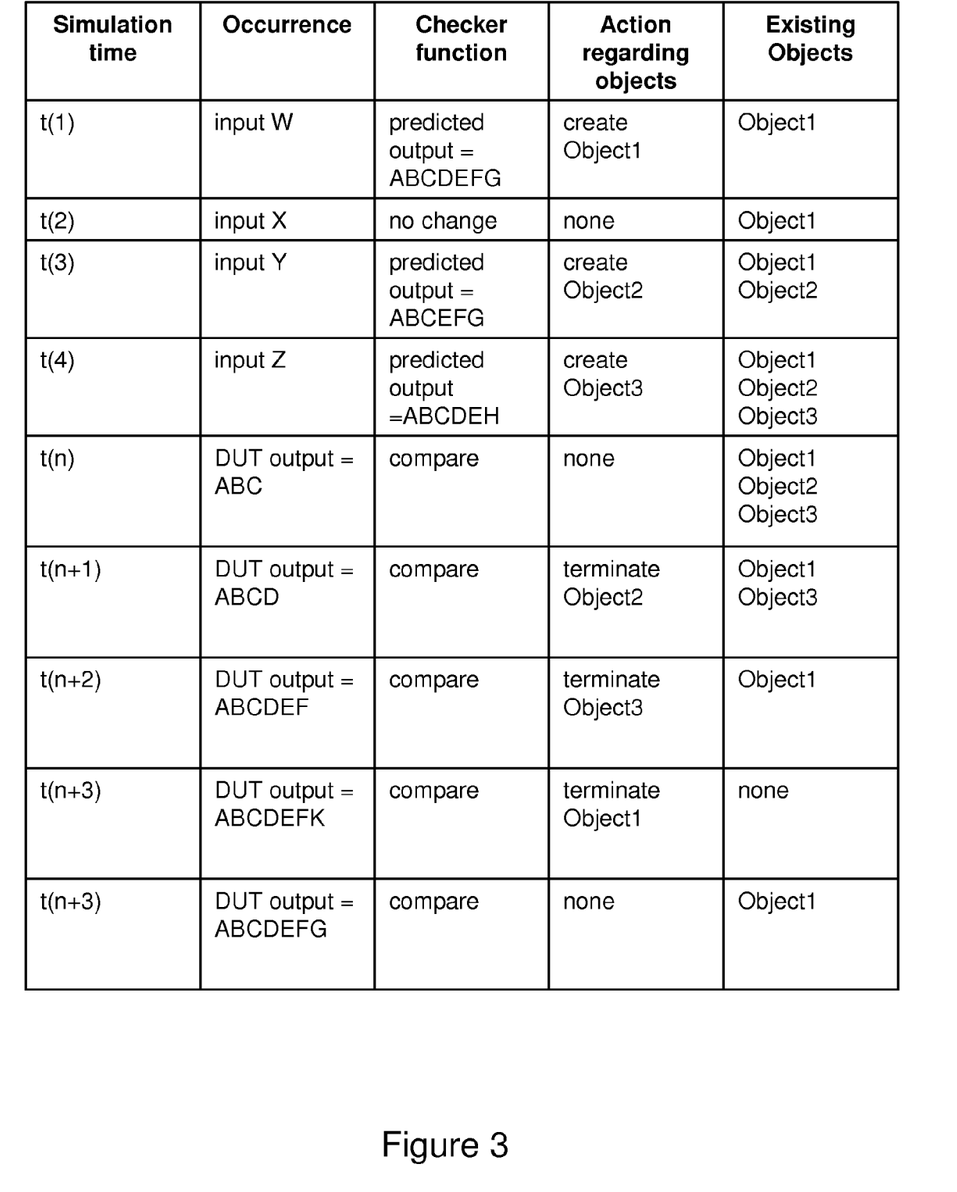
FIG. 3 shows an exemplary timeline according to aspects of the invention.

FIG. 3 shows a timeline of an exemplary implementation of the invention, showing simulation time, input, predicted behavior, actual behavior, and verification tasks. The predicted behavior and actual behavior are based upon a DUT that outputs data sequences, and the verification tasks are objects as described above. This example is for illustration purposes only, and is not intended to limit the scope of the invention.

At time t(1), input W is communicated to both the object manager and the DUT. The object manager predicts a possible output of the sequence A-B-C-D-E-F-G. Accordingly, the object manager creates an object, Object1, associated with the sequence A-B-C-D-E-F-G.

At time t(2), input X is communicated to both the object manger and the DUT. The object manager determines that no different behavior of the DUT is predicted. Accordingly, no new objects are created.

At time t(3), input Y is communicated to both the object manager and the DUT. Based upon the input and the circuit design specification, the object manager predicts a possible output comprising the sequence A-B-C-E-F-G, which is different from the other already existing predicted output. Accordingly, the object manager creates a new object, Object2, which is associated with the new sequence A-B-C-E-F-G.

At time t(4), input Z is communicated to both the object manager and the DUT. Based upon the input and the circuit design specification, the object manager predicts a possible output comprising the sequence A-B-C-D-E-H, which is different from the other already existing predicted outputs. Accordingly, the object manager creates a new object, Object3, which is associated with the new sequence A-B-C-D-E-H.

At time t(n), the DUT outputs the sequence A-B-C. This actual output of the DUT is communicated (e.g., via the object manager) to each of the existing objects: Object1, Object2, and Object3. Each object compares this actual sequence to its predicted sequence. In this example, all objects are still valid since the actual sequence does not violate their respective predicted sequences.

At time t(n+1), the DUT outputs the next symbol in the output sequence, resulting in an accumulated sequence of A-B-C-D. Again, this actual output is communicated to each existing object, which compares the actual output to a predicted output. In this example, Object2 is no longer valid, because its predicted sequence does not match the actual output of the DUT. Thus, Object2 is terminated (e.g., either by itself or by the object manager). However, Object1 and Object3 are still valid, and therefore remain in existence.

At time t(n+2), the DUT outputs the next symbol in the output sequence, resulting in an accumulated sequence of A-B-C-D-E-F. Again, this actual output is communicated to each existing object, which compares the actual output to a predicted output. In this example, Object3 is no longer valid, because its predicted sequence does not match the actual output of the DUT. Thus, Object3 is terminated (e.g., either by itself or by the object manager). However, Object1 is still valid, and therefore remains in existence.

Two alternative outputs are shown for a last actual output of the DUT at time t(n+3) to demonstrate further functionality of embodiments of the invention. In the first, the DUT outputs the next symbol in the output sequence, resulting in an accumulated sequence of A-B-C-D-E-F-K. This sequence does not conform to the predicted sequence of the only remaining object (Object1). Accordingly, a testing failure is indicated since the actual behavior of the DUT does not conform to the predicted behavior of the sole existing object.

In the second alternative output for time t(n+3), the DUT outputs the next symbol in the output sequence, resulting in an accumulated sequence of A-B-C-D-E-F-G. This actual output matches the predicted output of the remaining object(s) (i.e., Object1 in this example). If the time t(n+3) were the end of the simulation, the DUT would be deemed to have passed the test since all of the inputs have propagated through the DUT and the actual behavior of the DUT conforms to at least one instance of predicted behavior.

While the above example is described with respect to DUT that exhibits behavior in the form of data flow, the invention is not limited to such behavior. Rather, the invention may be used with DUT's that exhibit any type of behavior that can be predicted from the circuit design specification. For example, embodiments of the invention are also useful for verifying non-deterministic behavior of a DUT that exhibits behavior of a state machine. A state machine inside a DUT moves from one state to another based on stimulus to the design, without entering two states at the same time. Normally, it is not possible to determine when the transition happens. However, embodiments of the invention operate to verify the behavior of the DUT without needing to know exactly when a transition happens.

More specifically, in embodiments, the checker 115 creates a verification task associated with each possible state of the DUT. For example, when the checker 115 is realized using object oriented programming, each task may be an object associated with a particular possible state of the DUT (the possible state being predicted, for example, by an object manager based upon input(s) from the stimulus generator 105 and the circuit design specification). For example, when an input could cause a possible transition to a next state, the object manager creates a new object associated with that new state, unless an object already associated with that state exists.

As with the data flow example, each object compares its predicted state to the actual state of the DUT, and is terminated if its predicted state does not match the actual state. In this way, multiple objects representing multiple possible states of the DUT may exist at the same time. However, if all objects are terminated at any one time, then a testing failure is indicated, since such a situation represents an actual behavior that does not match any predicted behavior. This is demonstrated by Table 1.

TABLE 1

| Simulation Time | Event or DUT Behavior | Checker Action | Existing Objects |
|---|---|---|---|
| t = 0 | DUT enters state A | Manager creates object A | A |
| t = 10 | Input X | Manager predicts additional possible state B, and creates object B | A, B |
| t = 11 | DUT enters state B | Checker determines object A is invalid, and terminates object A | B |
| t = 15 | Input Y | Manager predicts additional possible state C, and creates object C | B, C |
| t = 16 | DUT enters state D | Checker determines objects B and C invalid, terminates objects B and C, and reports testing failure. | none |

PROCESSES OF THE INVENTION

The steps of the flow diagrams described herein may be implemented in the environment of FIGS. 1 and/or 2. The flow diagrams may equally represent a high-level block diagram of the invention. The steps of the flow diagrams may be implemented and executed from a server, in a client-server relationship, by computing devices in an ad hoc network, or they may run on a user workstation with operative information conveyed to the user workstation. Additionally, the invention can take the form of an entirely hardware embodiment, an entirely software embodiment or an embodiment containing both hardware and software elements. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. The software and/or computer program product can be implemented in the environments of FIGS. 1 and/or 2. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Figure 4:
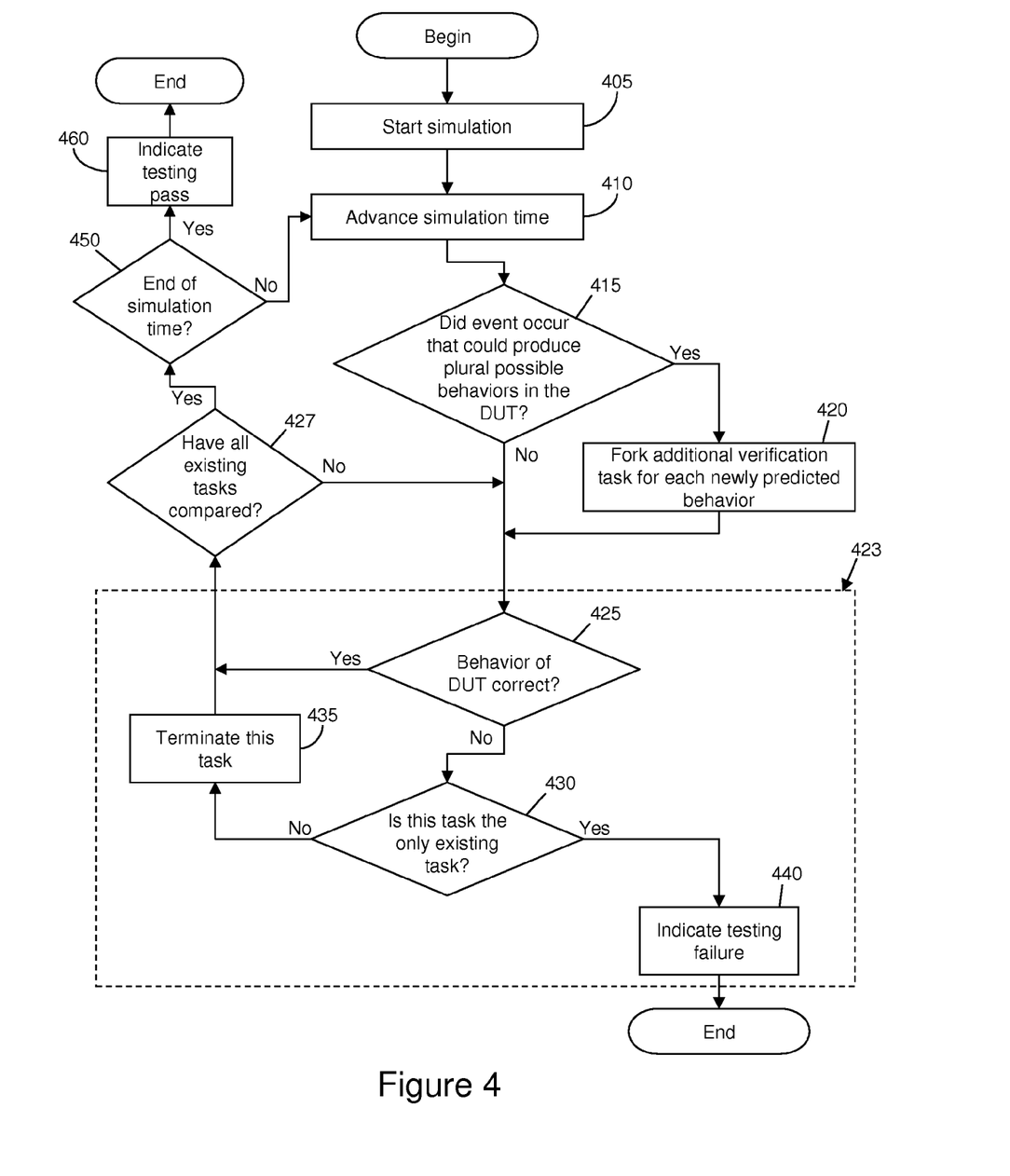
FIG. 4 shows a flow diagram depicting implementations of a method according to aspects of the invention.

FIG. 4 shows a flow diagram depicting steps of a method according to aspects of the invention. At step 405, a simulation of the DUT is started. In embodiments, this comprises running (e.g., executing) a software-based simulation tool in a computing environment, such as that described with respect to FIG. 1. More specifically, the simulation tool may include a checker having a manager, as described above with respect to FIG. 2.

At step 410, the simulation time is advanced. In embodiments, this comprises incrementing the time in the simulation tool. This can be accomplished for example, by the simulation tool monitoring a clock of a computing device, and incrementing the simulation time at the rising edge of each clock cycle. However, the invention is not limited to this method of advancing simulation time, and any suitable method may be used.

At step 415, the checker determines if an event occurs that could produce two or more possible behaviors in the DUT. In embodiments, an event is a signal or an input from a stimulus generator, or can also be the passage of time after such a signal or input. The checker monitors such events and predicts behavior of the DUT based upon the event and the specification of the circuit design, for example, as described above with respect to FIG. 2.

If the determination at step 415 is affirmative (e.g., there are plural predicted behaviors), then at step 420 a respective additional verification task is forked for each predicted behavior. Forking is a known programming concept meaning, generally, to create a parallel operation. For example, in embodiments of the invention that are implemented using object oriented programming, forking comprises the object manager of the checker creating a new object associated with each new predicted behavior. The object may comprise data associated with a particular predicted behavior and also the functionality to compare that data to actual behavior of the DUT, as described above with respect to FIG. 2. The invention is not limited to object oriented programming, however, and the forking may alternatively comprise, for example, procedural forking at an operating system level (e.g., a task manager creating parallel tasks).

After the forking of step 420, or when the determination at step 415 is negative, the process proceeds to block 423. Block 423 represents a group of operations that each existing task begins during a single iteration of the process. Block 423 is described with respect to a single task, but it is to be understood that each existing forked task undergoes at least one of the steps in block 423 during each iteration of the process.

At step 425, the simulation tool determines whether the actual behavior of the DUT is correct. In embodiments, the respective task compares its predicted behavior to the actual behavior of the DUT. For example, this may be accomplished using objects to verify data flow sequences as described above with respect to FIGS. 2 and 3. More specifically, the forked task may comprise an object that includes a predicted output sequence. The object may also include the functionality (via appropriate programming) to compare the predicted output sequence to the actual output sequence of the DUT. The actual output sequence of the DUT is passed to the object via the object manager, and the object compares the actual sequence to the predicted output sequence.

If the determination for a particular task at step 425 is affirmative, then at step 427 the manger determines whether all existing tasks have been through block 423. In embodiments, the manager of the checker monitors the progress of each task and determines whether all of the currently existing tasks have performed at least step 425 of block 423. The monitoring may be performed, for example, by each task communicating its progress to the manager. If the determination at step 427 is affirmative, then the process proceeds toward the next iteration, as described in further detail below. However, if all existing tasks have not performed at least step 425, then the process returns to block 423 for the remaining existing tasks.

If the determination for a particular task at step 425 is negative, then at step 430 the manager determines whether the particular task is the only existing task. Again, this may be done by the manager monitoring the status of each existing task. If other tasks exist, then it would not be prudent to report an error based upon this particular task's predicted behavior not matching the actual behavior of the DUT. Accordingly, if the determination at step 430 is "no," then at step 435 the particular task is terminated. For example, in the object oriented programming example, the object corresponding to the task is terminated, either by the object itself or by the object manager. Termination of objects in known, such that further explanation is not believed necessary.

However, if the determination at step 430 is affirmative, this indicates that the particular task is the only existing task. As it was already determined (at step 425) that the predicted behavior associated with this task does not match the actual behavior of the DUT, a testing failure is indicated at step 440. In embodiments, this is accomplished by the checker communicating a failure to an output, as described above with respect to FIG. 2.

As already described above, if at least one task is associated with a predicted behavior that matches the actual behavior of the DUT, the process will eventually proceed to step 427. When the determination at step 427 is affirmative, the process proceeds to step 450, where the simulation tool determines whether the simulation has reached the end of the simulation time. In embodiments, this is accomplished by the checker communicating with a predefined stimulus generator to determine whether the simulation is at its end. If the simulation is not at its end, then the process returns to step 410, where the simulation time is advanced and a new iteration is begun.

However, if at step 450 it is determined that the simulation is ended, then a testing pass is indicated at step 460. This is because at least one predicted behavior matches the actual behavior of the DUT at the end of the simulation time. In embodiments, this indication is accomplished by the checker communicating a testing pass message to an output, as described above with respect to FIG. 2.

Physical Interface Verification Example

In a particular exemplary embodiment, aspects of the invention are used to verify a PCI-Express Physical Interface (PHYIF) design. Typically, a PHYIF core (e.g., circuit design) contains several asynchronous crossings and is responsible for locking onto the correct bit alignment to properly decode the received serial data stream. The core receives twenty bits at a time from the serializer-deserializer (SERDES) and searches for a specific pattern from which lock can be obtained. The enabling of this lock detection is controlled by various factors, many of which originate in different clock domains. Due to the non-deterministic behavior of an asynchronous crossing, the time when the core enables the symbol lock logic is not predictable from the view of the verification environment. Therefore, when multiple symbol lock patterns are receive during the indeterminate time, it can not be predicted which pattern the core used to lock bit alignment and begin decoding.

However, aspects of the invention provide the ability to verify the PHYIF core by implementing a data flow embodiment (similar to, for example, that described with respect to FIGS. 2 and 3) in which a verification task is created (e.g., by the checker 115) for each time at which the data may have started the processing. Additionally, due to other non-deterministic specifications on the core behavior, separate tasks are also created when polarity is changed, or when data may have been repeated or may not have been dropped in the data stream. To accomplish this in an object oriented programming embodiment, the checker is implemented with the class structure depicted in FIG. 5.

Figure 5:
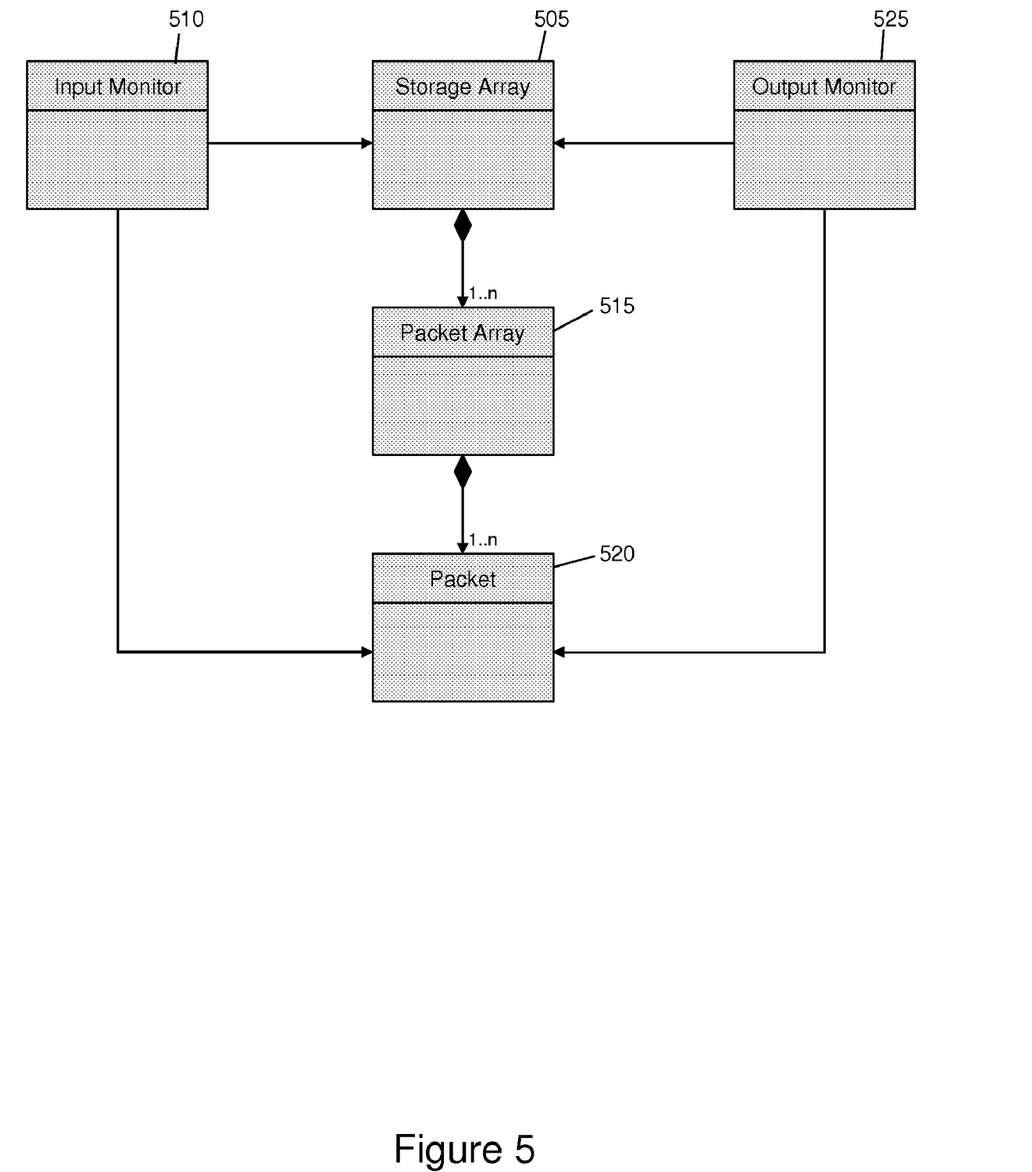
FIG. 5 shows an exemplary class structure according to aspects of the invention.

In embodiments, a storage array 505 is a class containing all of the possible receive output data sequences that are legal for the core to output based upon the receive input data. An input monitor 510 controls the creation of different predicted data sequences by indicating to the storage array 505 the characteristic associated with the received data symbol when it is stored in a packet 520 and passed (pushed) to the storage array 505. For each data sequence, the storage array 505 maintains a packet array 515 of packets 520 that it contains. Output monitor 525 monitors the output from the core (e.g., the DUT), storing the output symbol in a packet 520 that is passed (pushed) to the storage array 505 to be compared against each data sequence.

As the checker monitors the output of the core, it queues the data packets and queries the storage array to perform a match. Any predicted data sequence that does not match, is eliminated, and the remaining predicted data sequences are preserved for the next match request. If only one predicted data sequence matches the output data sequence, then that predicted data sequence is isolated and made the default. All other predicted data sequences are deleted. If none of the predicted data sequences match, then the storage array 505 reports an error. If a reset, or other event occurs that interrupts the data stream, happens when there are multiple predicted data sequences that match, then no error is reported since all sequences are possible and no mismatch has been detected. All data sequences are deleted and the process is restarted when the receive data stream restarts.

Several types of actions may be taken when a packet is pushed onto the storage array to create the different predicted data sequences. The actions include, but are not limited to, creating alternate predicted sequences based upon events that require 1) the start of the sequence to occur on a different symbol, 2) the skipping of one or more symbols in the sequence, 3) merging of two sequences at different symbols in the sequence, or 4) appending symbols to a subset of the existing predicted sequences. Each of these actions may create one or more alternative predicted sequences.

While the invention has been described in terms of embodiments, those skilled in the art will recognize that the invention can be practiced with modifications and in the spirit and scope of the appended claims.

What is claimed:

1. A method of verifying non-deterministic behavior of a design under test (DUT), comprising:
   predicting the non-deterministic behavior of the DUT comprising a plurality of behaviors of the DUT;
   forking respective verification tasks for each one of the plurality of behaviors, wherein the forking is performed as a result of the predicting the non-deterministic behavior;
   verifying an actual behavior of the DUT with each of the verification tasks; and
   terminating a respective one of the verification tasks when the actual behavior of the DUT does not conform to the respective one of the verification tasks,
   wherein the predicting, the forking, the verifying, and the terminating are performed using a computer device having a processor, and
   the predicting is performed in a software-based simulation of the DUT, and further comprising using the method to verify a core that contains several asynchronous crossings and that is responsible for locking onto a correct bit alignment to decode a received serial data stream, wherein the DUT comprises the core.

2. The method of claim 1, wherein the plurality of behaviors are based upon input to the DUT and a specification of expected performance of the DUT.

3. The method of claim 1, further comprising eliminating a redundant one of the verification tasks.

4. The method of claim 3, wherein the eliminating comprises identifying the redundant one of the verification tasks.

5. The method of claim 1, wherein the plurality of behaviors and the actual behavior comprise data flow sequences.

6. The method of claim 1, wherein the DUT comprises a state machine and the plurality of behaviors and the actual behavior comprise a state of the DUT.

7. The method of claim 1, wherein:
   the predicting and the forking are caused by an object manager of an object oriented programming based simulation tool that is embodied on a computer readable medium of a computing infrastructure,
   the respective verification tasks comprise respective objects,
   each of the respective objects includes a comparison functionality and data associated with a unique one of the predicted plurality of behaviors of the DUT, and
   the verifying is performed by each of the respective objects.

8. A method of verifying non-deterministic behavior of a design under test (DUT), comprising:
   receiving input that is provided to the DUT;
   determining the non-deterministic behavior of the DUT comprising a plurality of predicted behaviors of the DUT based upon the input and a specification associated with the DUT;
   creating respective tasks for each one of the predicted behaviors, wherein the creating the respective tasks is performed as a result of the determining the non-deterministic behavior;
   terminating a respective one of the tasks when the predicted behavior associated with the respective one of the tasks does not agree with actual behavior of the DUT; and
   generating and outputting either a test failure report or a success report associated with the DUT,
   wherein the receiving, the determining, the creating, the terminating, and the generating are performed using a computer device having a processor, and
   further comprising using the method to verify a core that contains several asynchronous crossings.

9. The method of claim 8, further comprising eliminating a redundant one of the tasks.

10. The method of claim 9, wherein the eliminating comprises identifying the redundant one of the tasks.

11. The method of claim 9, wherein:
    the plurality of predicted behaviors comprise predicted data flow sequences output by the DUT; and
    the actual behavior comprises an actual data flow sequence output by the DUT.

12. The method of claim 9, wherein:
    the DUT comprises an internal state machine;
    the plurality of predicted behaviors comprise predicted states of the DUT; and
    the actual behavior comprises an actual state of the DUT.

13. The method of claim 9, wherein at least one of the receiving, the determining, the creating, the terminating, and the generating and outputting is performed by a service provider under a subscription and/or fee agreement.

14. The method of claim 9, wherein a service provider at least one of creates, maintains, deploys, and supports a computer infrastructure that performs at least one of the receiving, the determining, the creating, the terminating, and the generating and outputting.

15. A computer program product for verifying non-deterministic behavior of a design under test (DUT), comprising a computer usable medium having a computer readable program embodied in the medium, the computer usable medium being an apparatus that stores the program, wherein the computer readable program when executed on a computing device is operable to cause the computing device to:
    start a simulation of the DUT;
    advance through iterations of the simulation, wherein at least one of the iterations includes:
      comparing a plurality of predicted behaviors of the DUT to an actual behavior of the DUT, wherein the plurality of predicted behaviors comprise the non-deterministic behavior of the DUT; and
      eliminating from consideration any of the plurality of predicted behaviors that do not agree with the actual behavior,
    wherein the computer readable program is further operable to cause the computing device to create a plurality of verification tasks as a result of predicting the non-deterministic behavior;
    eliminate redundant ones of the plurality of verification tasks; and
    verify a core that is responsible for locking onto a correct bit alignment to decode a received serial data stream.

16. The computer program product of claim 15, wherein each one of the plurality of predicted behaviors is associated with a respective one of the plurality of verification tasks.

17. The computer program product of claim 15, wherein the plurality of predicted behaviors are determined based upon input to the DUT and a specification associated with the DUT.

18. The computer program product of claim 15, wherein the plurality of predicted behaviors and the actual behavior comprise data flow sequences or a state of the DUT.

* * * * *